(12) United States Patent
Chan et al.

(10) Patent No.: US 9,520,492 B2
(45) Date of Patent: Dec. 13, 2016

(54) SEMICONDUCTOR DEVICE HAVING BURIED LAYER

(71) Applicant: Macronix International Co., Ltd., Hsinchu (TW)

(72) Inventors: Ching-Lin Chan, Huwei Township (TW); Shyi-Yuan Wu, Hsinchu (TW); Cheng-Chi Lin, Toucheng Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/625,435

(22) Filed: Feb. 18, 2015

(65) Prior Publication Data

US 2016/0240657 A1 Aug. 18, 2016

(51) Int. Cl.

| H01L 29/66 | (2006.01) |
|---|---|
| H01L 29/78 | (2006.01) |
| H01L 29/73 | (2006.01) |
| H01L 29/86 | (2006.01) |
| H01L 29/739 | (2006.01) |
| H01L 29/861 | (2006.01) |

(52) U.S. Cl.
CPC ....... *H01L 29/7816* (2013.01); *H01L 29/6609* (2013.01); *H01L 29/66325* (2013.01); *H01L 29/66681* (2013.01); *H01L 29/7393* (2013.01); *H01L 29/861* (2013.01)

(58) Field of Classification Search
CPC ............. H01L 29/7816; H01L 29/6609; H01L 29/66325; H01L 29/66681; H01L 29/7393; H01L 29/861
See application file for complete search history.

(56) References Cited

U.S. PATENT DOCUMENTS

| 7,893,457 | B2 * | 2/2011 | Madathil | H01L 29/7397 257/120 |
|---|---|---|---|---|
| 7,989,890 | B2 * | 8/2011 | Huang | H01L 29/063 257/341 |
| 8,236,642 | B2 * | 8/2012 | Wei | H01L 29/1083 257/E21.382 |
| 8,450,800 | B2 * | 5/2013 | Inomata | H01L 29/0634 257/329 |
| 8,575,693 | B1 * | 11/2013 | Huang | H01L 29/42372 257/331 |
| 8,637,899 | B2 * | 1/2014 | Salcedo | H01L 27/0262 257/173 |
| 8,890,244 | B2 * | 11/2014 | Lin | H01L 29/0634 257/342 |
| 8,975,693 | B2 * | 3/2015 | Lee | H01L 29/7816 257/335 |
| 9,054,026 | B2 * | 6/2015 | Chan | H01L 27/0629 |
| 9,190,535 | B2 * | 11/2015 | Yeh | H01L 29/404 |
| 9,196,714 | B2 * | 11/2015 | Patti | H01L 29/0834 |
| 9,245,997 | B2 * | 1/2016 | Hebert | H01L 29/7816 |
| 9,312,346 | B2 * | 4/2016 | Mauder | H01L 29/0615 |

(Continued)

*Primary Examiner* — Ida M Soward
(74) *Attorney, Agent, or Firm* — Finnegan, Henderson, Farabow, Garrett & Dunner LLP

(57) ABSTRACT

A semiconductor device includes a substrate having a first conductivity type, a high-voltage well having a second conductivity type and formed in the substrate, a drift region formed in the high-voltage well, and a buried layer having the first conductivity type formed below the high-voltage well and vertically aligned with the drift region.

10 Claims, 16 Drawing Sheets

(56) References Cited

U.S. PATENT DOCUMENTS

| | | | |
|---|---|---|---|
| 9,312,380 B2* | 4/2016 | Chan | H01L 29/1087 |
| 9,343,568 B2* | 5/2016 | Chan | H03K 17/687 |
| 9,419,085 B2* | 8/2016 | Darwish | H01L 29/408 |
| 2002/0005549 A1* | 1/2002 | Saito | H01L 21/26533 257/328 |
| 2002/0094627 A1* | 7/2002 | Porter | H01L 27/0255 438/200 |
| 2004/0036115 A1* | 2/2004 | Disney | H01L 21/823418 257/342 |
| 2004/0217419 A1* | 11/2004 | Rumennik | H01L 29/0619 257/343 |
| 2006/0284276 A1* | 12/2006 | Yilmaz | H01L 29/0634 257/492 |
| 2008/0261358 A1* | 10/2008 | Sonsky | H01L 21/3247 438/197 |
| 2009/0090968 A1* | 4/2009 | Ono | H01L 29/0619 257/341 |
| 2009/0160009 A1* | 6/2009 | Dietz | H01L 21/743 257/506 |
| 2010/0001344 A1* | 1/2010 | Stefanov | H01L 29/0623 257/339 |
| 2012/0104492 A1* | 5/2012 | Chu | H01L 29/0634 257/335 |
| 2013/0093010 A1* | 4/2013 | Huang | H01L 29/7816 257/335 |
| 2013/0093014 A1* | 4/2013 | Cho | H01L 27/0623 257/337 |
| 2013/0093017 A1* | 4/2013 | Ko | H01L 29/66659 257/343 |
| 2013/0344672 A1* | 12/2013 | Yang | H01L 21/761 438/294 |
| 2014/0021560 A1* | 1/2014 | Su | H01L 27/0629 257/380 |
| 2014/0065781 A1* | 3/2014 | Chen | H01L 29/0634 438/286 |
| 2014/0139282 A1* | 5/2014 | Yeh | H01L 29/404 327/430 |
| 2014/0225156 A1* | 8/2014 | Zhan | H01L 29/66325 257/164 |
| 2014/0225190 A1* | 8/2014 | Mallikarjunaswamy | H01L 21/823807 257/334 |
| 2015/0035583 A1* | 2/2015 | Cheng | H01L 29/402 327/382 |
| 2015/0214361 A1* | 7/2015 | Chan | H01L 29/66689 257/339 |
| 2015/0325639 A1* | 11/2015 | Liao | H01L 29/41758 327/434 |

* cited by examiner

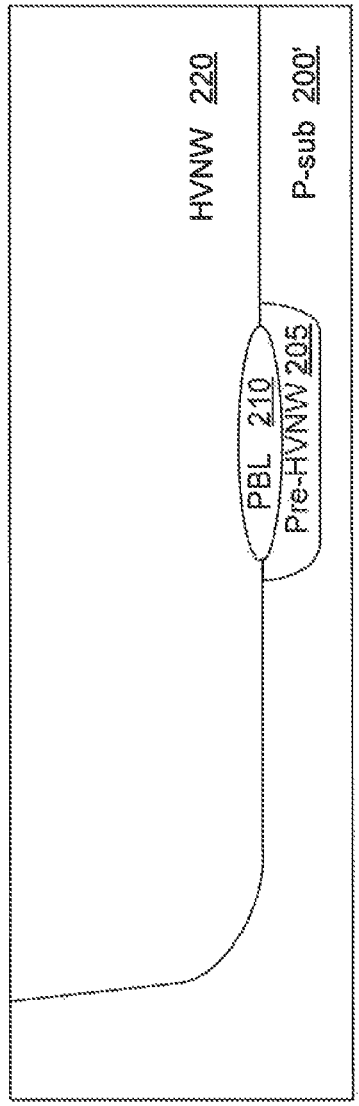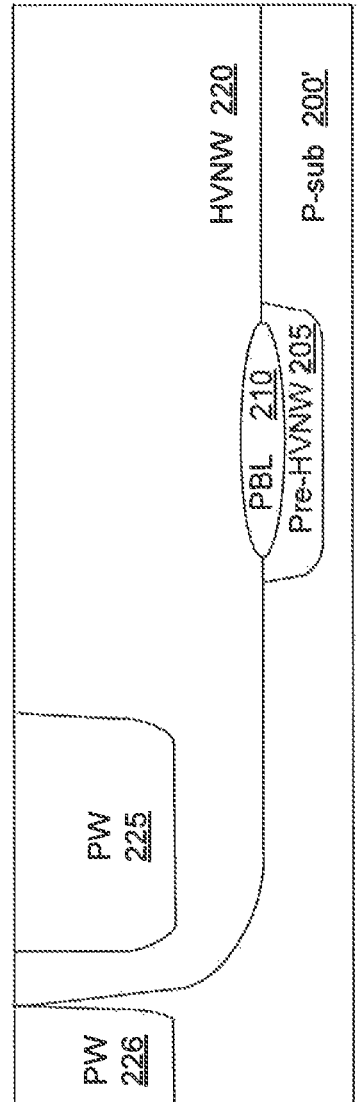

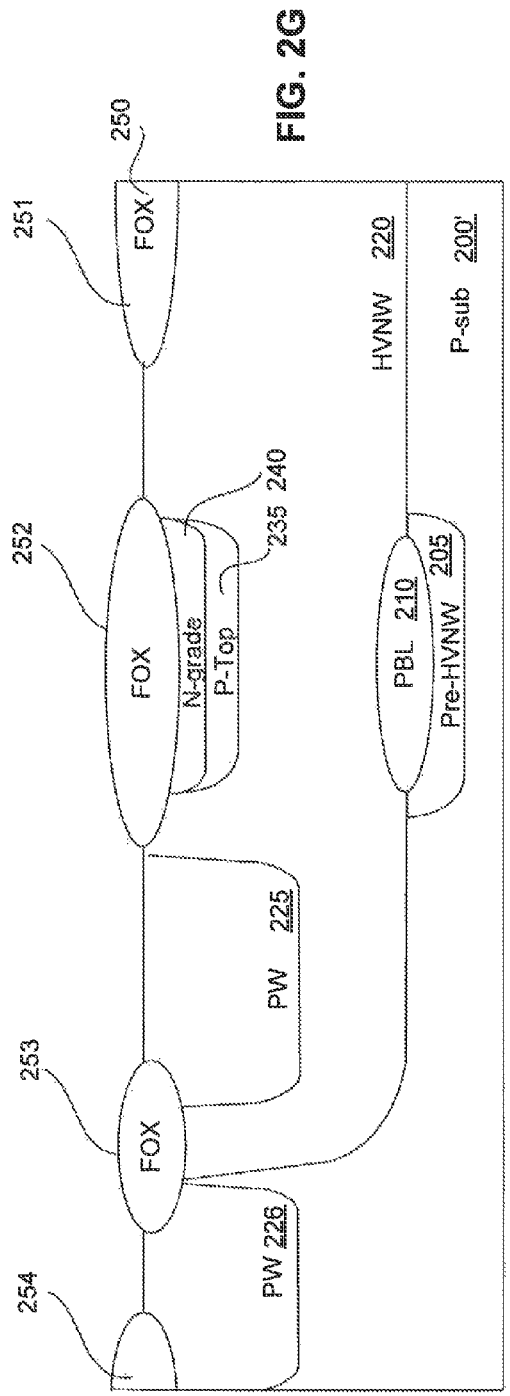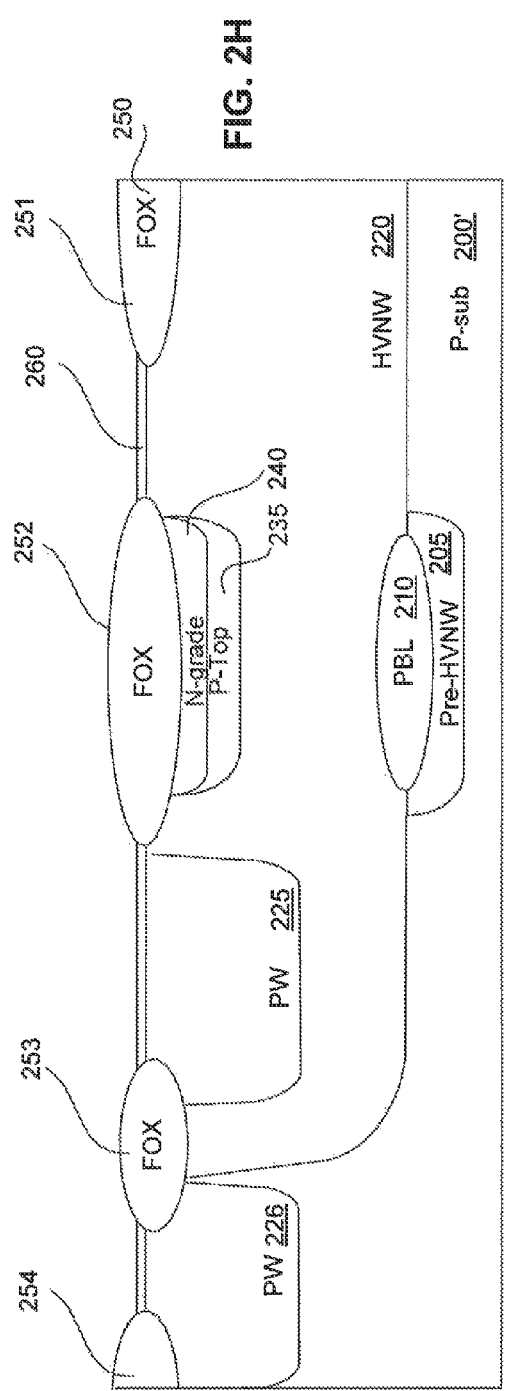

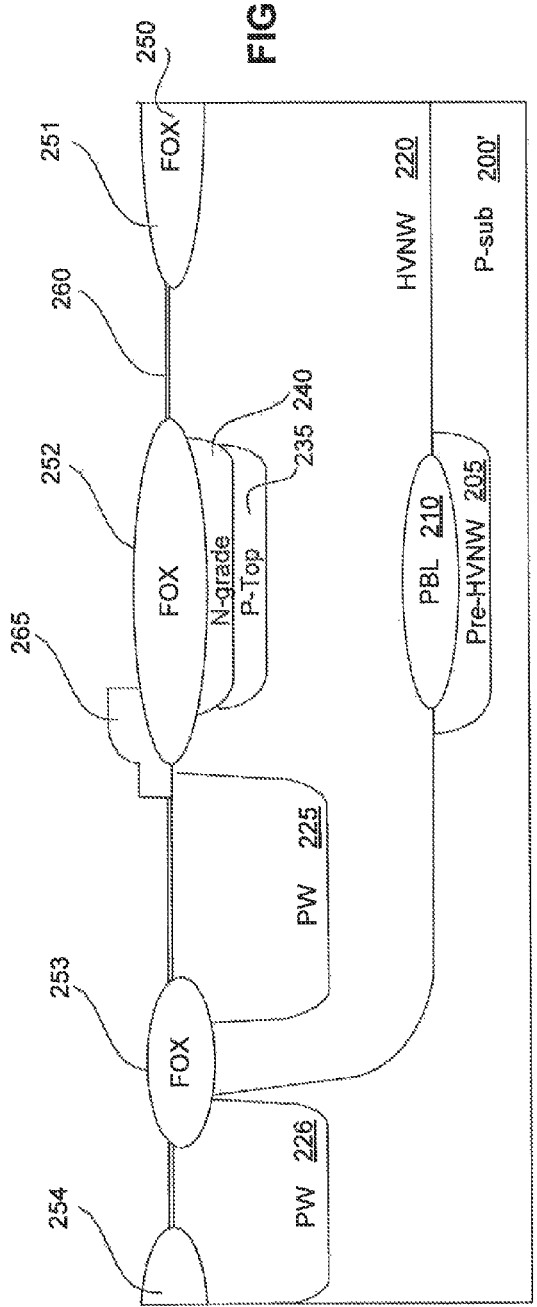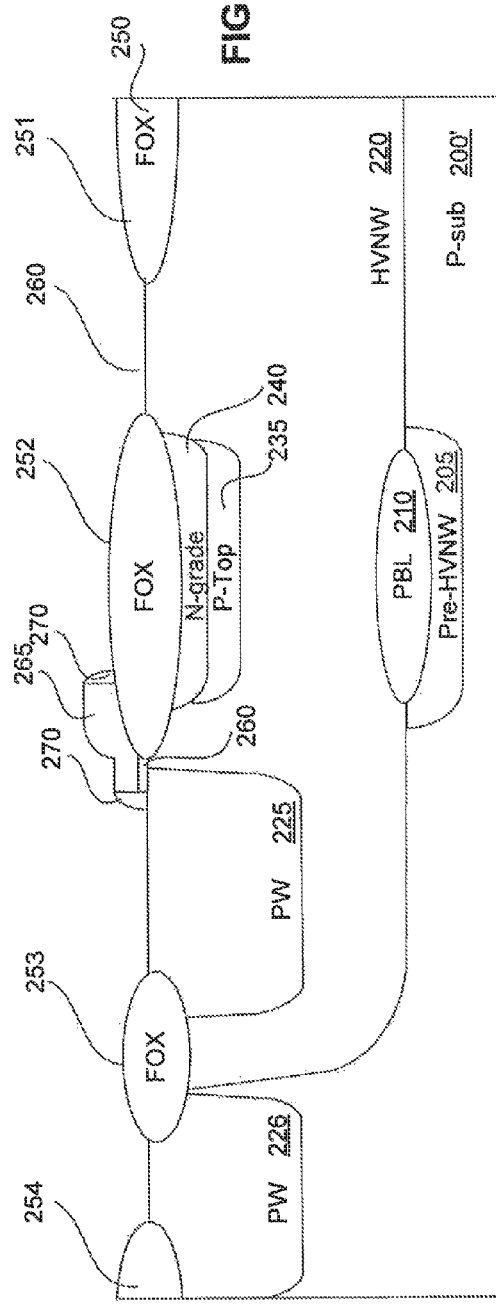

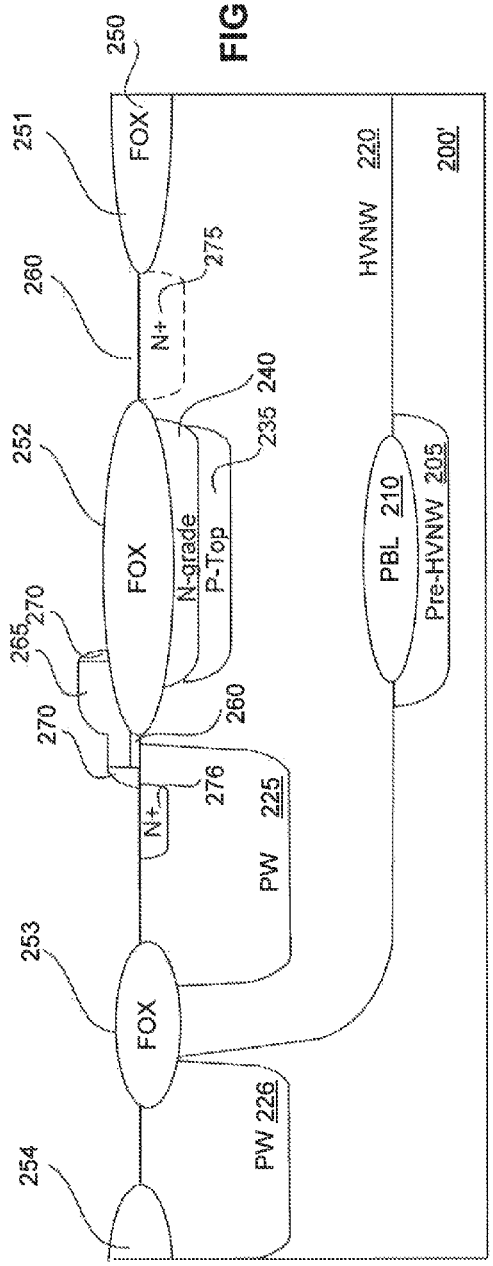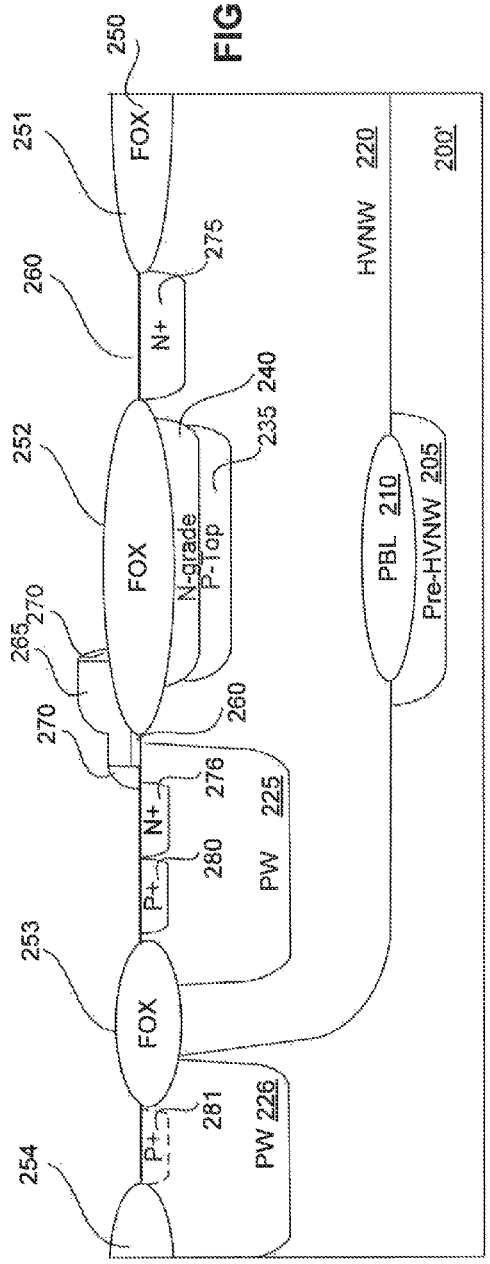

US 9,520,492 B2

SEMICONDUCTOR DEVICE HAVING BURIED LAYER

FIELD OF THE DISCLOSURE

The present disclosure relates to a semiconductor device and a method of fabricating the same and, more particularly, to a semiconductor device having a buried layer and a method of fabricating the same.

BACKGROUND OF THE DISCLOSURE

Ultra-high voltage (ultra-HV) semiconductor devices are widely used in display devices, portable devices, and many other applications. Design goals of the ultra-HV semiconductor devices include high breakdown voltage, and low specific on-resistance. The specific on-resistance of the ultra-HV semiconductor device is limited by a doping concentration of a grade region of the device. When the doping concentration of the grade region decreases, the specific on-resistance increases.

SUMMARY

According to an embodiment of the disclosure, a semiconductor device includes a substrate having a first conductivity type, a high-voltage well having a second conductivity type and formed in the substrate, a drift region formed in the high-voltage well, and a buried layer having the first conductivity type formed below the high-voltage well and vertically aligned with the drift region.

According to another embodiment of the disclosure, a method for fabricating a semiconductor device is provided. The method includes providing a substrate having a first conductivity type, forming a buried layer having the first conductivity type in the substrate, forming an epitaxial layer having the first conductivity type over the substrate formed with the buried layer, forming a high-voltage well having a second conductivity type in the epitaxial layer, and forming a drift region in the high-voltage well, the drift region being vertically aligned with the buried layer.

The accompanying drawings, which are incorporated in and constitute a part of this specification, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
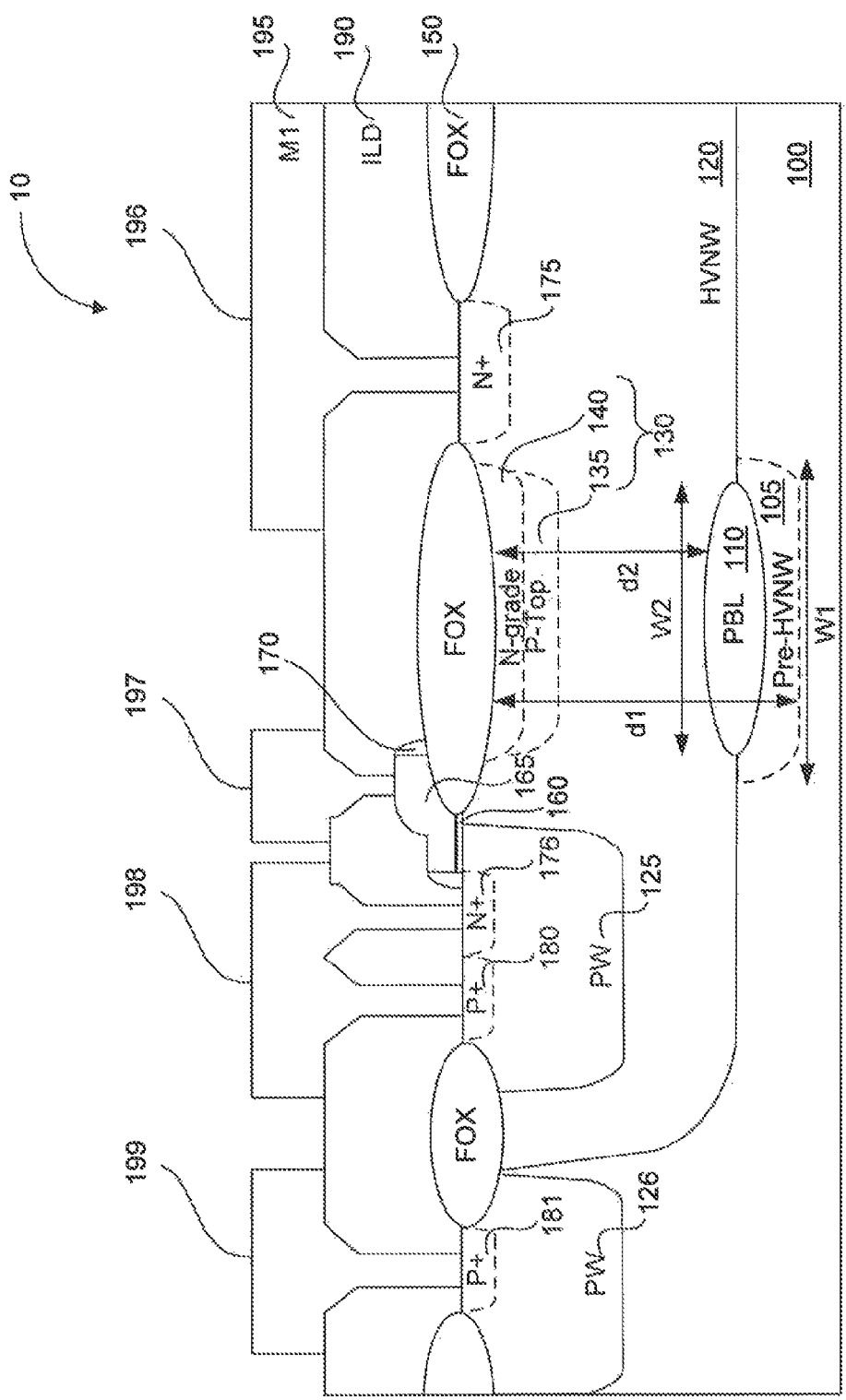
FIG. 1 schematically illustrates a cross-sectional view of an ultra-high voltage semiconductor device, according to an embodiment.

FIG. 1 schematically illustrates a cross-sectional view of an ultra-HV semiconductor device 10 (hereinafter referred to as "device 10"), according to an illustrated embodiment. Device 10 is an N-type lateral diffused metal oxide semiconductor (LDMOS) device that is designed to accommodate high-voltage operation (e.g., 40V or higher) or even ultra-high-voltage operation (e.g., 400V or higher) relatively to other semiconductor devices. As illustrated in FIG. 1, device 10 includes a P-type substrate (P-sub) 100, and a high-voltage N-well (HVNW) 120 formed in P-sub 100. A first P-well (PW) 125 is formed in HVNW 120 and functions as a source well. A second PW 126 is formed outside and adjacent to HVNW 120 and functions as a bulk well. A drift region 130 is formed in HVNW 120 and spaced apart from first PW 125. Drift region 130 includes a P-top region 135 and an N-grade region 140 formed above P-top region 135. An insulation layer 150 provided, for example, as a field oxide (FOX), is formed on P-sub 100. A gate oxide layer 160 is formed on a side (i.e., right-side) edge portion of first PW 125. A gate layer 165 is formed on gate oxide layer 160. Spacers 170 are formed on side walls of gate layer 165. A first $N^+$-region 175 is formed in HVNW 120 and constitutes a drain region of device 10. A second $N^+$-region 176 is formed in first PW 125 adjacent to a side (e.g., left-side) edge portion of gate layer 165. A first $P^+$-region 180 is formed in first PW 125 adjacent to second $N^+$-region 176. Second $N^+$-region 176 and first $P^+$-region 180 together constitute a source region of device 10. A second $P^+$-region 181 is formed in second PW 126 and constitutes a bulk region of device 10. An interlayer dielectric (ILD) layer 190 is formed on P-sub 100. A contact layer 195 provided, for example, as a metal layer (M1), is formed on ILD layer 190. Contact layer 195 includes a plurality of isolated contact portions for conductively contacting different portions of the structures formed in P-sub 100 via different openings formed in ILD layer 190. Specifically, contact layer 195 includes a first contact portion 196 that conductively contacts first $N^+$-region 175, a second contact portion 197 that conductively contacts gate layer 165, a third contact portion 198 that conductively contacts second $N^+$-region 176 and first $P^+$-region 180, and a fourth contact portion 199 that conductively contacts second $P^+$-region 181. Additional ILD layers and contact layers can be formed on P-sub 100.

Device 10 also includes a pre-HVNW 105 and a P-type buried layer (PBL) 110 formed below HVNW 120, i.e., between a bottom of HVNW 120 and P-sub 100. Specifically, pre-HVNW 105 is formed under and adjacent to a bottom surface of HVNW 120. PBL 110 is disposed above pre-HVNW. Pre-HVNW 105 and PBL 110 are vertically (i.e., along a thickness direction of P-sub 100) aligned with and substantially overlap drift region 130.

In an ultra-HV device formed without pre-HVNW 105 and PBL 110, a maximum doping concentration in N-grade region 140 is limited by a doping concentration in P-top region 135. Thus, it is difficult for the ultra-HV device to achieve a high breakdown voltage and a low specific on-resistance. On the other hand, device 10 according to the illustrated embodiment includes pre-HVNW 105 and PBL 110 formed below HVNW 120 and vertically aligned with drift region 130 to assist in formation of a full depletion region. As a result, a doping concentration in HVNW 120 can be increased, or a doping concentration in PWs 125 and 126 can be decreased, which has the effect of reducing the specific on-resistance of device 10.

Figure 2A:
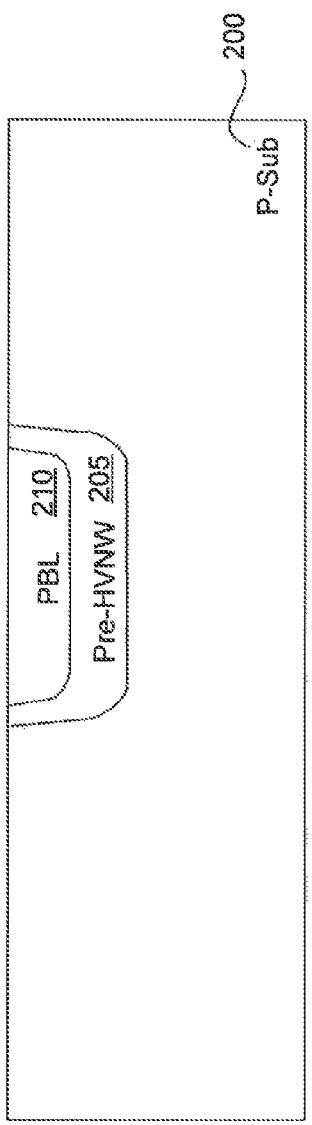
FIGS. 2A-2N schematically illustrate a process of fabricating the device of FIG. 1, according to an illustrated embodiment.
Figure 2B:
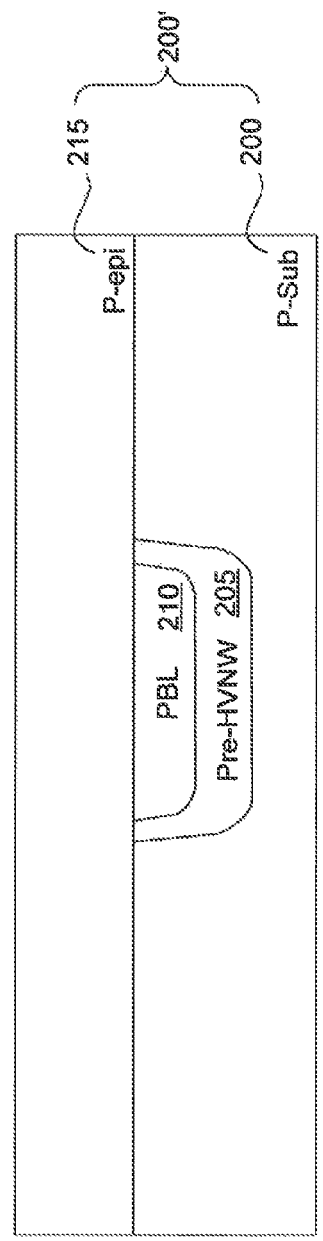
Figure 2E:
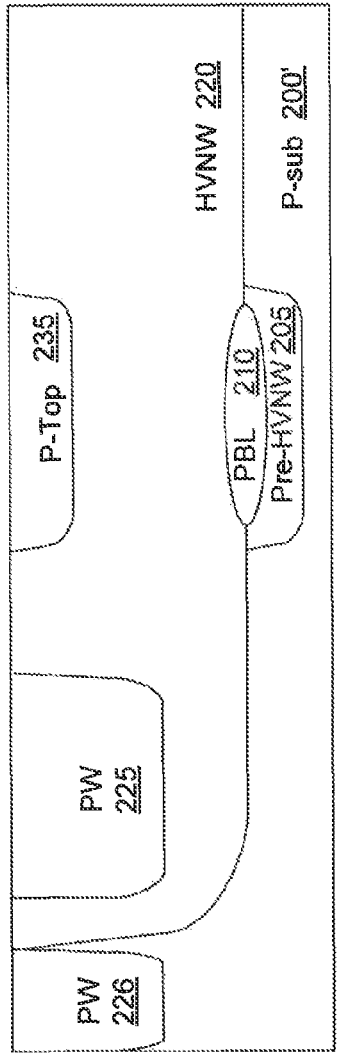
Figure 2F:
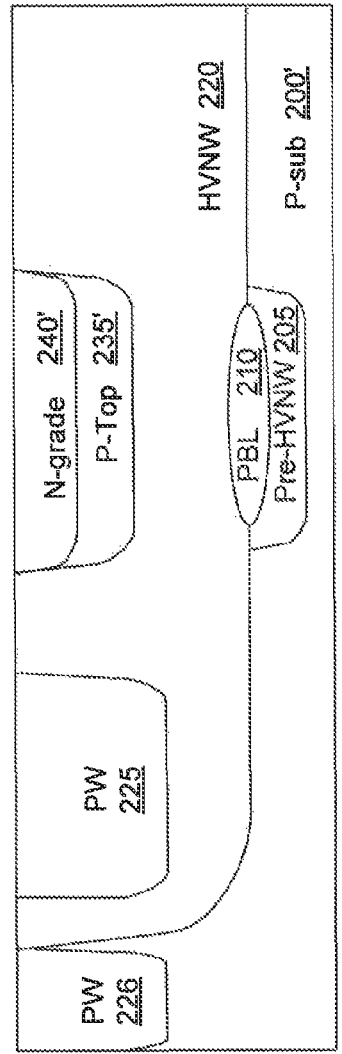
Figure 2M:
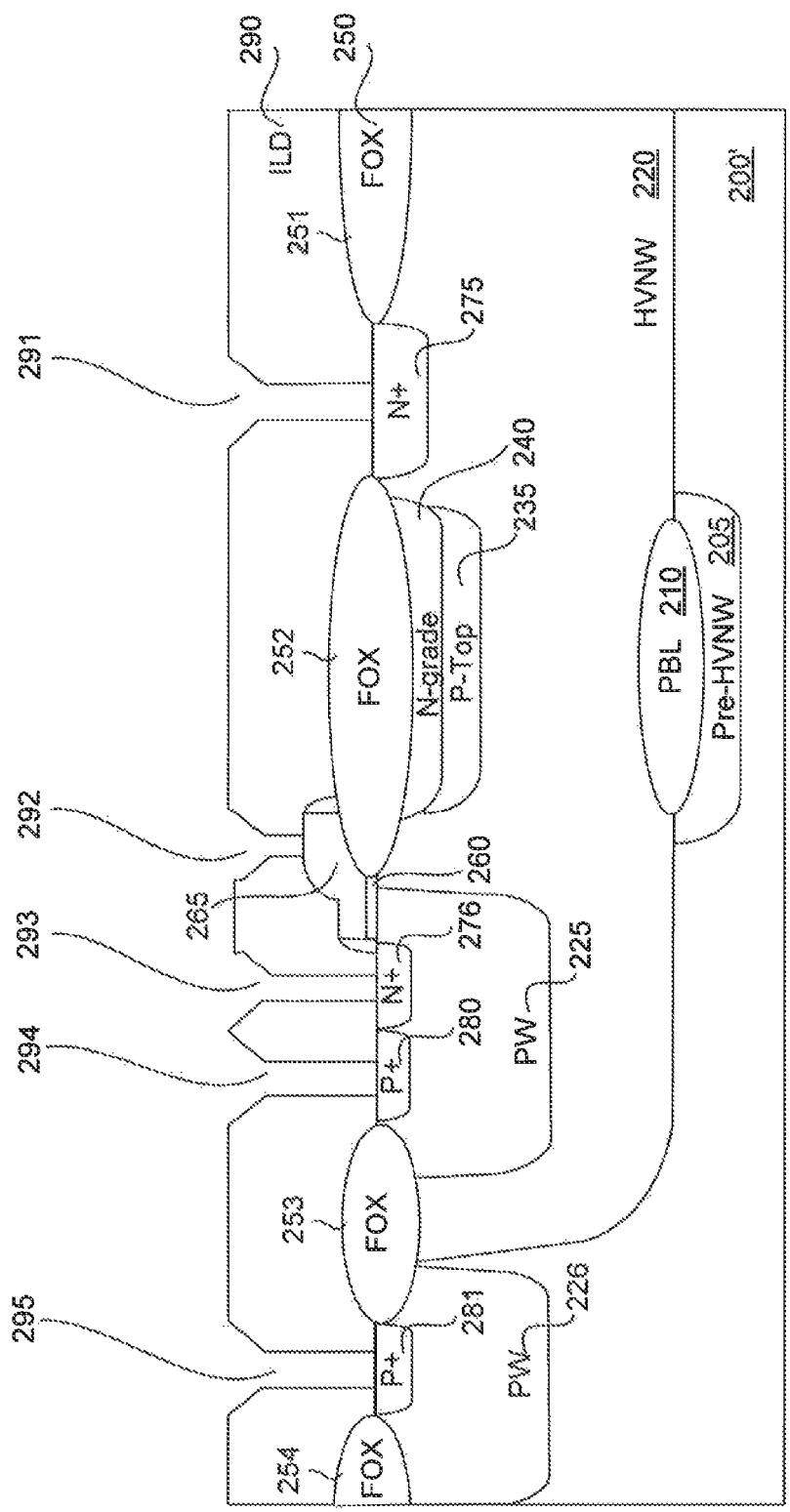
Figure 2N:
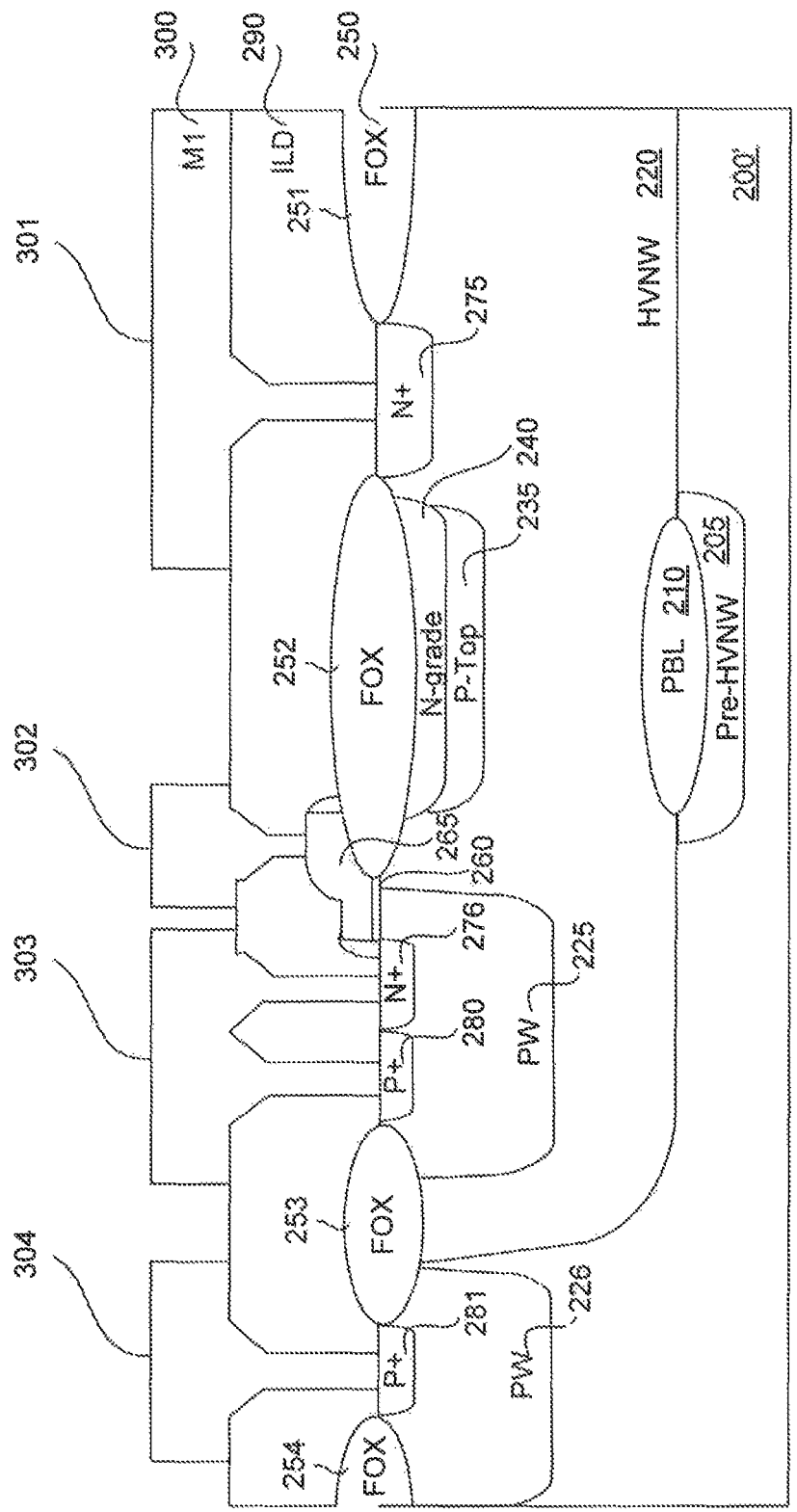

FIGS. 2A-2N schematically illustrate a process of fabricating device 10 of FIG. 1, according to an illustrated embodiment.

First, referring to FIG. 2A, a P-type substrate (P-sub) 200 is provided. P-sub 200 can be formed of a P-type bulk silicon material, or a P-type silicon-on-insulator (SOI) material. A pre-HVNW 205 is formed in P-sub 200, extending downward from a top surface of P-sub 200. Pre-HVNW 205 is formed by a photolithography process that defines a region in P-sub 200 in which pre-HVNW 205 is to be formed, and an ion implantation process for implanting an N-type dopant (e.g., phosphorus or arsenic) into the defined region. A PBL 210 is formed in pre-HVNW, extending downward from a top surface of pre-HVNW 205. PBL 210 is formed by an ion implantation process for implanting a P-type dopant (e.g., boron) into pre-HVNW 205. After the ion implantation processes for forming pre-HVNW 205 and PBL 210, a heating process is performed for driving-in the implanted dopants to reach predetermined depths of pre-HVNW 205 and PBL 210. Pre-HVNW 205 is deeper than PBL 210.

Referring to FIG. 2B, a P-type epitaxial layer (P-epi) 215 is deposited over P-sub 200 having pre-HVNW 205 and PBL 210 formed therein. P-epi 215 is formed by epitaxially growing over P-sub 200. P-epi 215 and P-sub 200 together constitute P-sub 200' for device 10 of FIG. 1.

Referring to FIG. 2C, a HVNW 220 is formed in P-sub 200', extending downward from a top surface of P-sub 200', and connecting to pre-HVNW 205 and PBL 210. HVNW 220 is formed by a photolithography process that defines a region in P-sub 200' in which HVNW 220 is to be formed, an ion implantation process for implanting an N-type dopant into the defined region, and a heating process for driving-in the implanted dopant to reach pre-HVNW 205 and PBL 210, so that the bottom of HVNW 220 is connected to pre-HVNW 205 and PBL 210. During the heating process, a portion of the P-type dopants in PBL 210 moves into HVNW 220 such that PBL 210 extends into HVNW 220.

Referring to FIG. 2D, a first P-well (PW) 225 is formed in HVNW 220, close to an edge portion of HVNW 220. A second PW 226 is formed in P-sub 200', outside and adjacent to the edge portion of HVNW 220. First PW 225 and second PW 226 are formed by a photolithography process that defines regions in which first PW 225 and second PW 226 are to be formed, an ion implantation process for implanting a P-type dopant into the defined regions, and a heating process for driving-in the implanted dopant to reach a predetermined depth.

Referring to FIG. 2E, a P-top implantation region 235' is formed in HVNW 220, extending downward from a top surface of HVNW 220. P-top implantation region 235' is formed in a region that is aligned with pre-HVNW 205 and PBL 210 to overlap pre-HVNW 205 and PBL 210. That is, P-top implantation region 235' are vertically (along a thickness direction of P-sub 200') aligned with pre-HVNW 205 and PBL 210. P-top implantation region 235' is formed by a photolithography process that defines a region in which P-top implantation region 235' is to be formed, and an ion implantation process for implanting a P-type dopant into the defined region.

Referring to FIG. 2F, an N-grade implantation region 240' is formed in P-top implantation region 235', extending downward from a top surface of P-top implantation region 235'. N-grade implantation region 240' is formed by a photolithography process that defines a region in which N-grade implantation region 240' is to be formed, and an ion implantation process for implanting an N-type dopant (e.g., phosphorus or arsenic) into the defined region.

Referring to FIG. 2G, an insulation layer in the form of a field oxide layer (FOX) 250 is formed on the top surface of P-sub 200'. FOX layer 250 includes a first FOX portion 251 covering a right edge portion of HVNW 220, a second FOX portion 252 covering P-top implantation region 235' and N-grade implantation region 240', a third FOX portion 253 covering a left edge portion of HVNW 220 between first PW 225 and second PW 226, and a fourth FOX portion 254 covering a left edge portion of second PW 226. FOX layer 250 is formed by a deposition process that deposits a silicon nitride layer, a photolithography process that defines regions where FOX layer 250 is to be formed, an etching process that removes the silicon nitride layer in the defined regions, and a thermal oxidation process that forms FOX layer 250 in the defined regions. During the thermal oxidation process for forming FOX layer 250, the P-type dopant in P-top implantation region 235' and the N-type dopant in N-grade implantation region 240' are driven to predetermined depths in HVNW 220 to form P-top region 235 and N-grade region 240, respectively.

Referring to FIG. 2H, a gate oxide layer 260 is formed on surface portions of the structure of FIG. 2G that are not covered by FOX layer 250. That is, gate oxide layer 260 is formed between first FOX portion 251 and second FOX portion 252, between second FOX portion 252 and third FOX portion 253, and between third FOX portion 253 and fourth FOX portion 254. Gate oxide layer 260 is formed by a sacrificial oxidation process to form a sacrificial oxide layer, a cleaning process to remove the sacrificial oxide layer, and an oxidation process to form gate oxide layer 260.

Referring to FIG. 2I, a gate layer 265 is formed on gate oxide layer 260, overlying a left portion of second FOX portion 252 and a right portion of first PW 225. Gate layer 265 can include a polysilicon layer and a tungsten silicide layer formed on the polysilicon layer. The thickness of gate layer 265 can be about 0.1 μm to 0.7 μm. Gate layer 265 is formed by a deposition process for depositing a polysilicon layer and a tungsten silicide layer over the entire substrate, a photolithography process that defines a region where gate layer 265 is to be formed, and an etching process that removes the polysilicon layer and the tungsten silicide layer outside the defined region.

Referring to FIG. 2J, spacers 270 are formed on both sides of gate layer 265. Spacers 270 are formed of tetraethoxysilane (TEOS) oxide films. Spacers 270 are formed by a deposition process that deposits the TEOS oxide film, a photolithography process that defines regions where spacers 270 are to be formed, and an etching process that removes the TEOS oxide film outside the defined regions. After spacers 270 are formed, gate oxide layer 260, except for the portion under gate layer 265 and spacers 270, is removed by etching.

Referring to FIG. 2K, a first $N^+$-region 275 is formed in HVNW 220 between first FOX portion 251 and second FOX portion 252, and a second $N^+$-region 276 is formed in first PW 225 adjacent to a left edge portion of gate layer 265 and under a left-side spacer 270. First N⁺-region 275 and second N⁺-region 276 are formed by a photolithography process that defines regions where first N⁺-region 275 and second N⁺-region 276 are to be formed, and an ion implantation process for implanting a N-type dopant into the defined regions.

Referring to FIG. 2L, a first P⁺-region 280 is formed in first PW 225 adjacent to second N⁺-region 276, and a second P⁺-region 281 is formed in second PW 226 between third FOX portion 253 and fourth FOX portion 254. First P⁺-region 280 and second P⁺-region 281 are formed by a photolithography process that defines regions where first P⁺-region 280 and second P⁺-region 281 are to be formed, and an ion implantation process for implanting a P-type dopant into the defined regions.

Referring to FIG. 2M, an interlayer dielectric (ILD) layer 290 is formed on the entire surface of the structure of FIG. 2L. ILD layer 290 includes a first opening 291 that is vertically aligned with first N⁺-region 275, a second opening 292 that is vertically aligned with gate layer 265, a third opening 293 that is vertically aligned with second N⁺-region 276, a fourth opening 294 that is vertically aligned with first P⁺-region 280, and a fifth opening 295 that is vertically aligned with second P⁺-region 281. ILD layer 290 can include undoped silicate glass (USG) and/or borophosphosilicate glass (BPSG). ILD layer 290 is formed by a deposition process for depositing a layer of USG and/or BPSG, a photolithography process that defines regions where ILD layer 290 is to be formed, and an etching process that removes the layer of USG and/or BPSG outside the defined regions for forming openings 291 through 295.

Referring to FIG. 2N, a contact layer 300 is formed on the structure of FIG. 2M. Contact layer 300 includes a first contact portion 301 that contacts first N⁺-region 275, a second contact portion 302 that contacts gate layer 265, a third contact portion 303 that contacts both second N⁺-region 276 and first P⁺-region 280, and a fourth contact portion 304 that contacts second P⁺-region 281. Contact layer 300 can be made of any electrically conductive metal, such as aluminum, copper, or an aluminum-copper alloy. Contact layer 300 is formed by a deposition process that deposits a metal layer, a photolithography process that defines regions where contact layer 300 is to be formed, and an etching process that removes the metal layer outside the defined regions.

Figure 3:
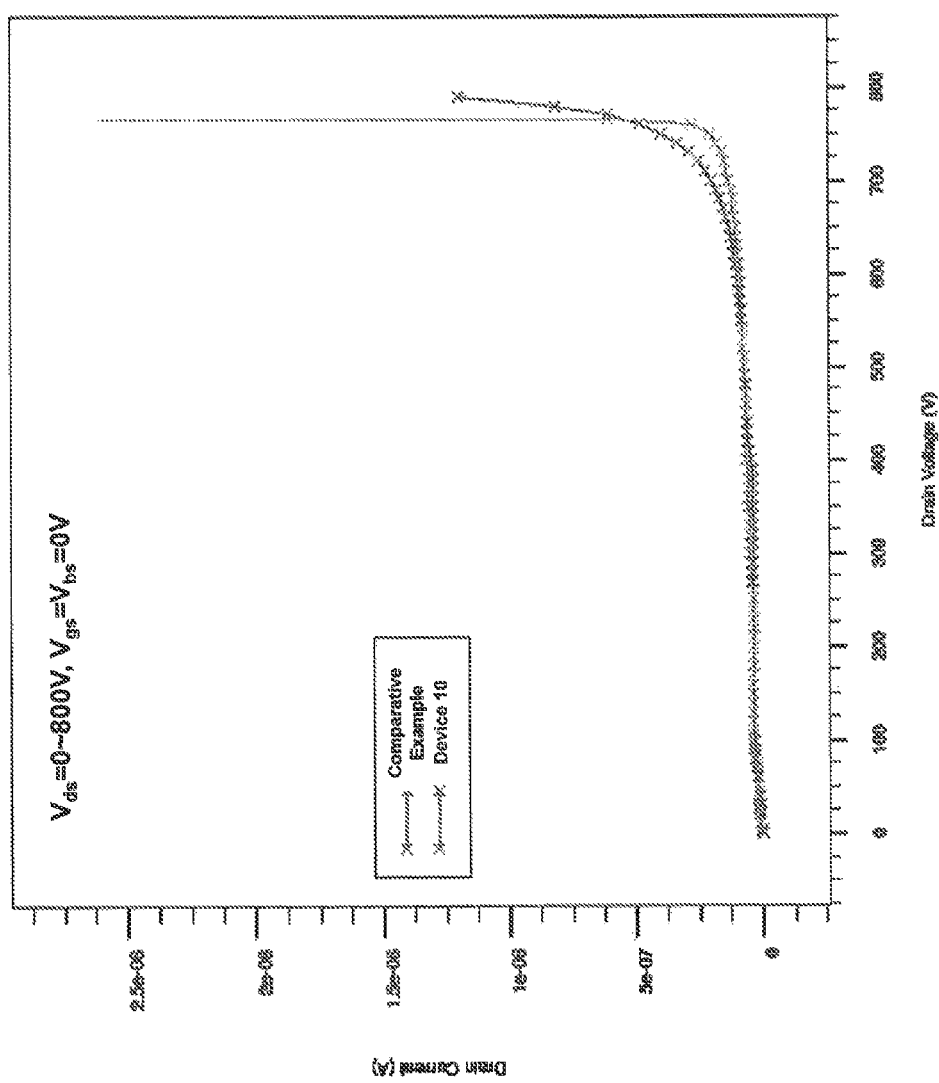
FIG. 3 is a graph showing drain characteristics of the device of FIG. 1, and of a device constructed as a comparative example.

FIG. 3 is a graph showing drain characteristics of device 10 having pre-HVNW 105 and PBL 110 as illustrated in FIG. 1, and of a device constructed as a comparative example. The device of the comparative example has a structure similar to that of device 10, except that the device of the comparative example does not include pre-HVNW 105 and PBL 110. In FIG. 3, a drain-source voltage $V_{DS}$ (i.e., the voltage applied between first N⁺-region 175 as the drain region and second N⁺-region 176 and first P⁺-region 180 as the source region) varies from 0 to 800V, and a gate-source voltage $V_{GS}$ (i.e., the voltage applied between gate layer 165 and second N⁺-region 176 and first P⁺-region 180 as the source region) and a bulk-source voltage $V_{BS}$ (i.e., the voltage applied between second P⁺-region 181 as the bulk region and second N⁺-region 176 and first P⁺-region 180 as the source region) are maintained at 0V. As illustrated in FIG. 3, the off-breakdown voltage of both of device 10 and the device of the comparative example are above 750V. Therefore, device 10 has approximately the same off-breakdown voltage as that of the device of the comparative example.

Figure 4:
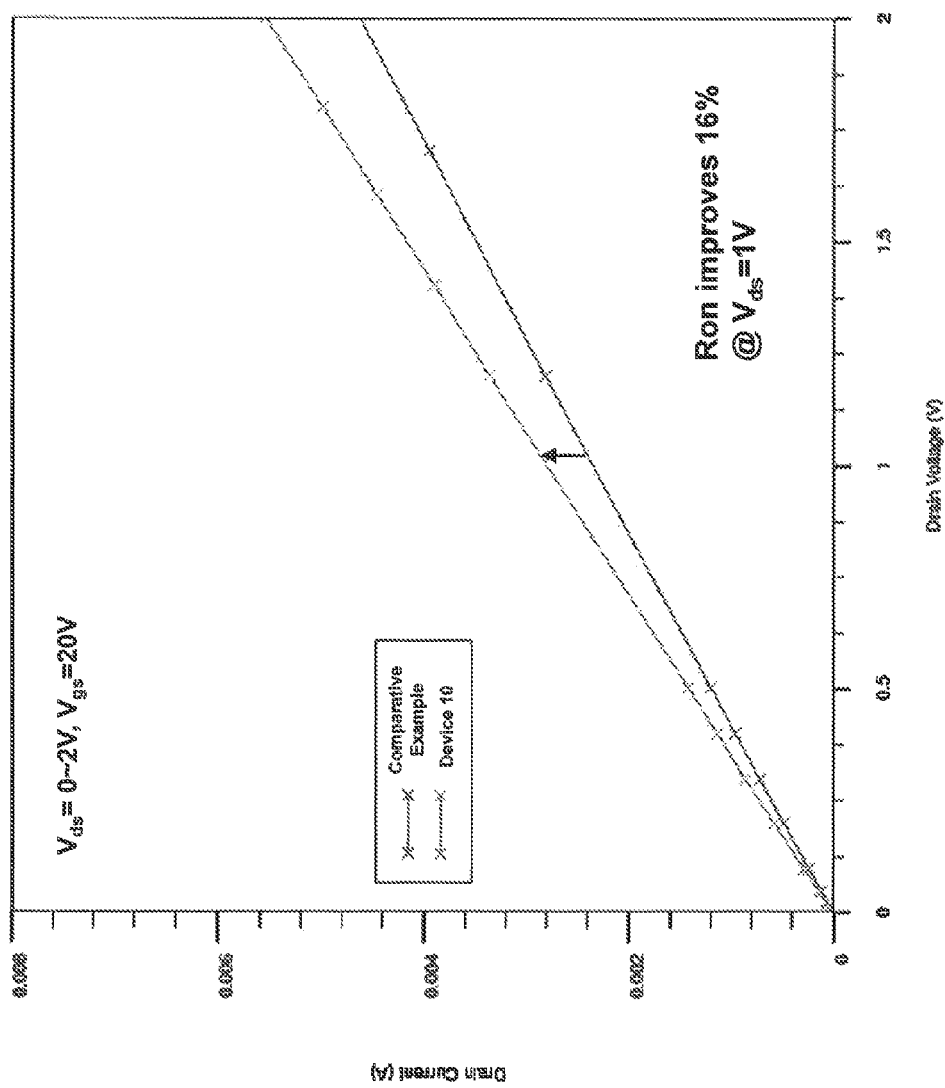
FIG. 4 is a graph showing the drain characteristics of the device of FIG. 1 and of the device constructed as the comparative example.

FIG. 4 is a graph showing the drain characteristics of device 10 and of the device of the comparative example. In FIG. 4, $V_{DS}$ varies from 0 to 2V, and $V_{GS}$ is maintained at 20V. As illustrated in FIG. 4, for the same value of $V_{DS}$ (e.g., 1 V), a drain-source current $I_{DS}$ of device 10 is higher than that of the device of the comparative example, and the specific on-resistance Ron of device 10 improves about 16% than that of the device of the comparative example. Therefore, device 10 has a lower specific on-resistance than that of the device of the comparative example, while having the same off-breakdown voltage as that of the device of the comparative example.

In device 10 illustrated in FIG. 1, the widths and depths of pre-HVNW 105 and PBL 110 are variables determined in view of various design considerations. In device 10 of the illustrated embodiment, width W2 of PBL 110 along the gate width direction is smaller than width W1 of pre-HVNW 105. However, width W2 of PBL 110 can be the same as width W1 of pre-HVNW 105. Alternatively, width W2 of PBL 110 can be larger than width W1 of pre-HVNW 105. In addition, depth d2 of PBL 110 (the distance between the bottom surface of insulation layer 150 and the top surface of PBL 110) is smaller than depth d1 of pre-HVNW 105 (the distance between the bottom surface of insulation layer 150 and the bottom surface of pre-HVNW 105).

Figure 5:
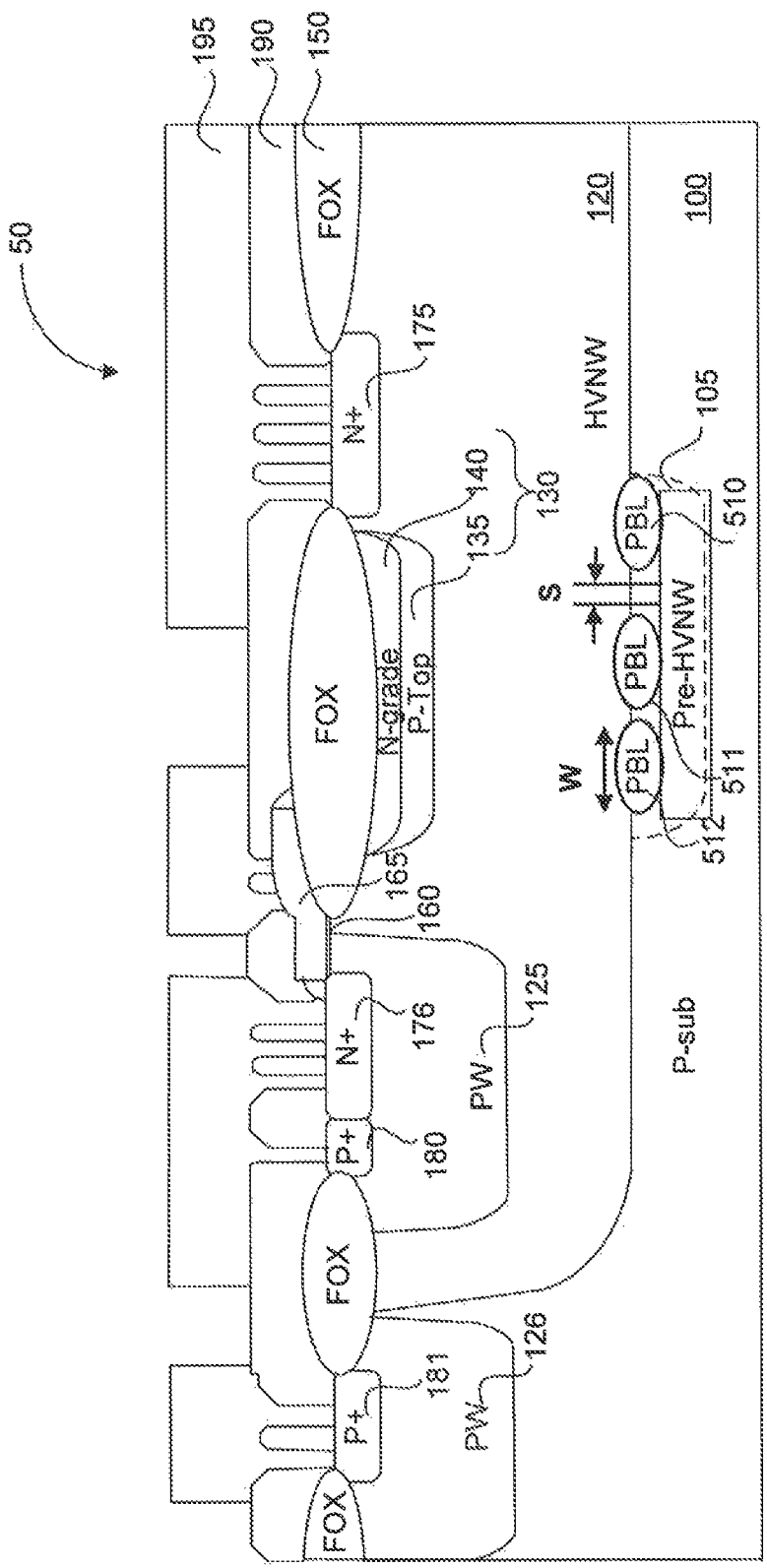
FIG. 5 schematically illustrates a cross-sectional view of a device, according to an illustrated embodiment.

Device 10 illustrated in FIG. 1 includes a single PBL 110 and a single pre-HVNW 105. However, in some embodiments, multiple PBLs can be included in a device. FIG. 5 schematically illustrates a cross-sectional view of a device 50 according to such an embodiment. Device 50 has a structure similar to that of device 10, except that three (3) PBLs 510, 511, and 512 are formed at the bottom of HVNW 120. The widths W of PBLs 510, 511, and 512, and the spaces S between PBLs 510, 511, and 512 can be varied in view of various design considerations. In addition, the number of PBLs can be varied.

Figure 6:
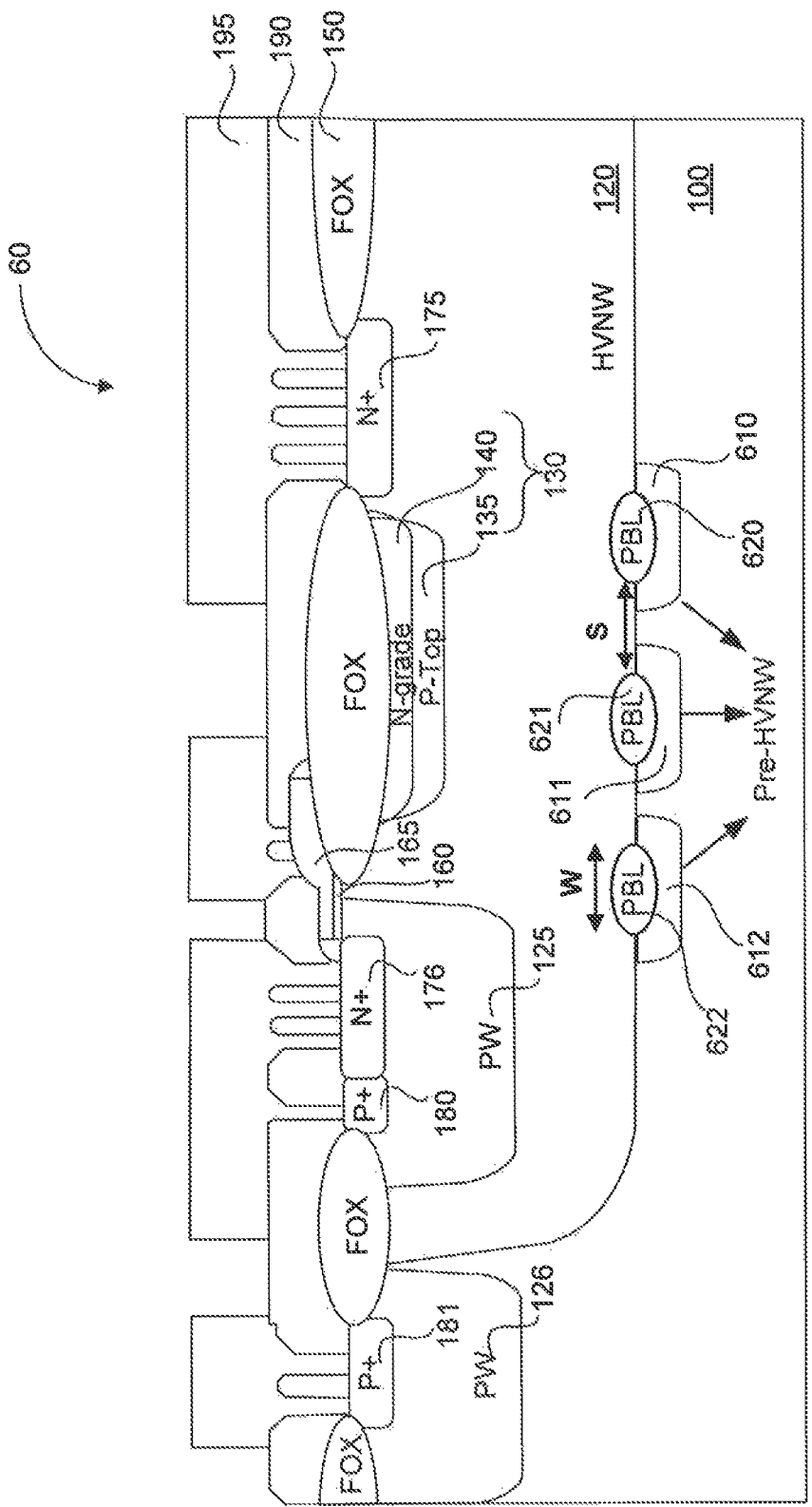
FIG. 6 schematically illustrates a cross-sectional view of a device, according to an illustrated embodiment.

In some embodiments, multiple PBLs and multiple pre-HVNWs can be included in a device. FIG. 6 schematically illustrates a cross-sectional view of a device 60 according to such an embodiment. Device 60 has a structure similar to that of device 10, except that three (3) pre-HVNWs 610, 611, and 612, and three (3) PBLs 620, 621, and 622 are formed between the bottom of HVNW 120 and P-sub 100. Specifically, pre-HVNWs 610, 611, and 612 are formed under and adjacent to the bottom surface of HVNW 120. Pre-HVNWs 610, 611, and 612 are spaced apart from each other. PBLs 620, 621, and 622 are respectively disposed above pre-HVNWs 610, 611, and 612 and HVNW 220. PBLs 620, 621, and 622 are spaced apart from each other. Each one of PBLs 620, 621, and 622 vertically overlaps with a corresponding one of pre-HVNWs 610, 611, and 612. The widths of pre-HVNWs 610, 611, and 612, and PBLs 620, 621, and 622, the spaces between pre-HVNWs 610, 611, and 612, and the spaces between PBLs 620, 621, and 622 can be varied in view of various design considerations. In addition, the numbers of PBLs and pre-HVNWs can be varied. During a fabrication process of device 60, pre-HVNWs 610, 611, and 612 can be first formed in P-sub 100, and then PBLs 620, 621, and 622 can be formed above pre-HVNWs 610, 611, and 612, respectively. After forming pre-HVNWs 610, 611, and 612 and PBLs 620, 621, and 622, a P-type epitaxial layer can be formed on P-sub 100.

Figure 7:
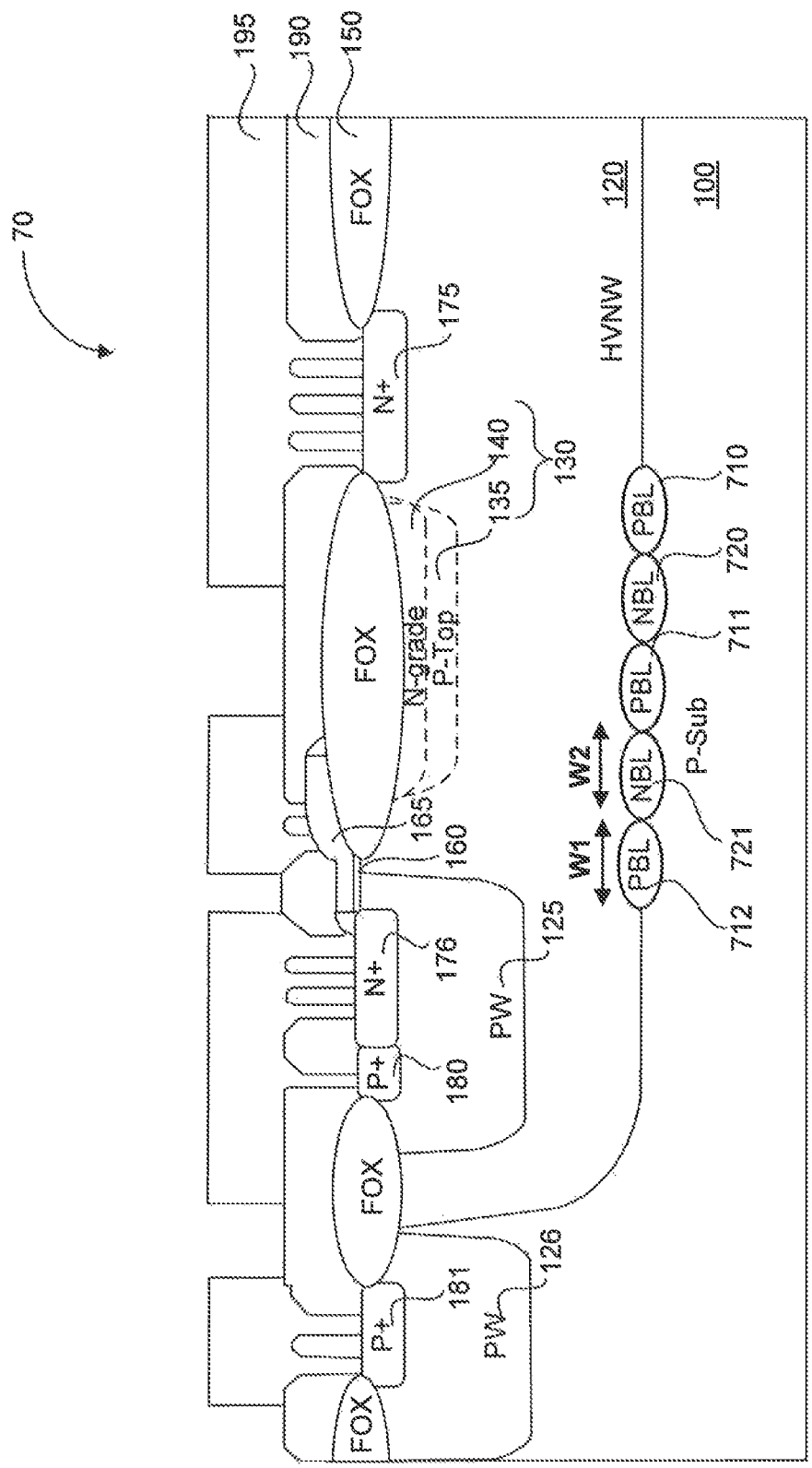
FIG. 7 schematically illustrates a cross-sectional view of a device, according to an illustrated embodiment.

In some embodiments, multiple N-type buried layers (NBLs) and multiple PBLs can be included in a device. The multiple NBLs and PBLs can be alternatively arranged. FIG. 7 schematically illustrates a cross-sectional view of a device 70 according to such an embodiment. Device 70 has a structure similar to that of device 10, except that three (3) PBLs 710, 711, and 712, and two (2) NBLs 720 and 721 are formed between HVNW 120 and P-sub 100. PBLs 710, 711, and 712, and NBLs 720 and 721 are alternately arranged. Specifically, PBLs 710, 711, and 712 are spaced apart from each other, and each one of NBLs 720 and 721 is arranged between two adjacent PBLs. That is, NBL 720 is arranged between PBLs 710 and 711, and NBL 721 is arranged between PBLs 711 and 712. The widths of PBLs 710, 711, and 712, and NBLs 720 and 721 can be varied in view of various design considerations. In addition, the numbers of PBLs and NBLs can be varied. During a fabrication process of device 70, PBLs 710, 711, and 712 can be formed in P-sub 100, and then NBLs 720 and 721 can be formed between PBLs 710, 711, and 712. After forming PBLs 710, 711, and 712, and NBLs 720 and 721, a P-type epitaxial layer can be formed on P-sub 100.

While the embodiment described above is directed to N-type LDMOS device 10 shown in FIG. 1 and fabrication methods thereof shown in FIGS. 2A-2N, those skilled in the art will now appreciate that the disclosed concepts are equally applicable to a P-type LDMOS device. Those skilled in the art will also appreciate that the disclosed concepts are applicable to other semiconductor devices and the fabrication methods thereof, such as insulated-gate bipolar transistor (IGBT) devices and diodes.

Figure 8:
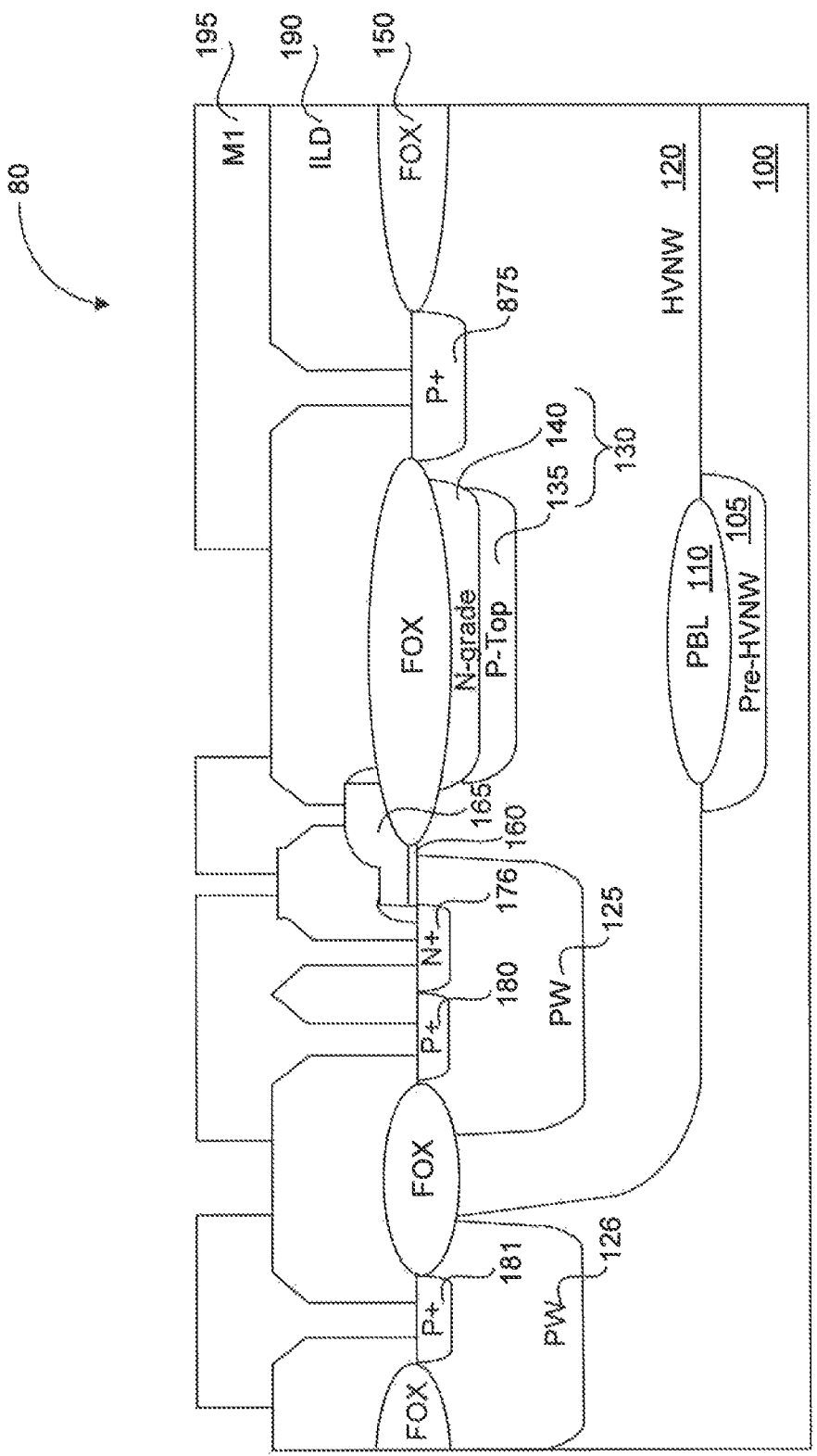
FIG. 8 schematically illustrates a cross-sectional view of an insulated gate bipolar transistor, according to an illustrated embodiment.

FIG. 8 schematically illustrates a cross-sectional view of an insulated gate bipolar transistor (IGBT) 80, according to an illustrated embodiment. IGBT 80 has a structure similar to that of device 10, except that first $N^+$-region 175 is replaced with a $P^+$-region 875 which functions as a drain region.

Figure 9:
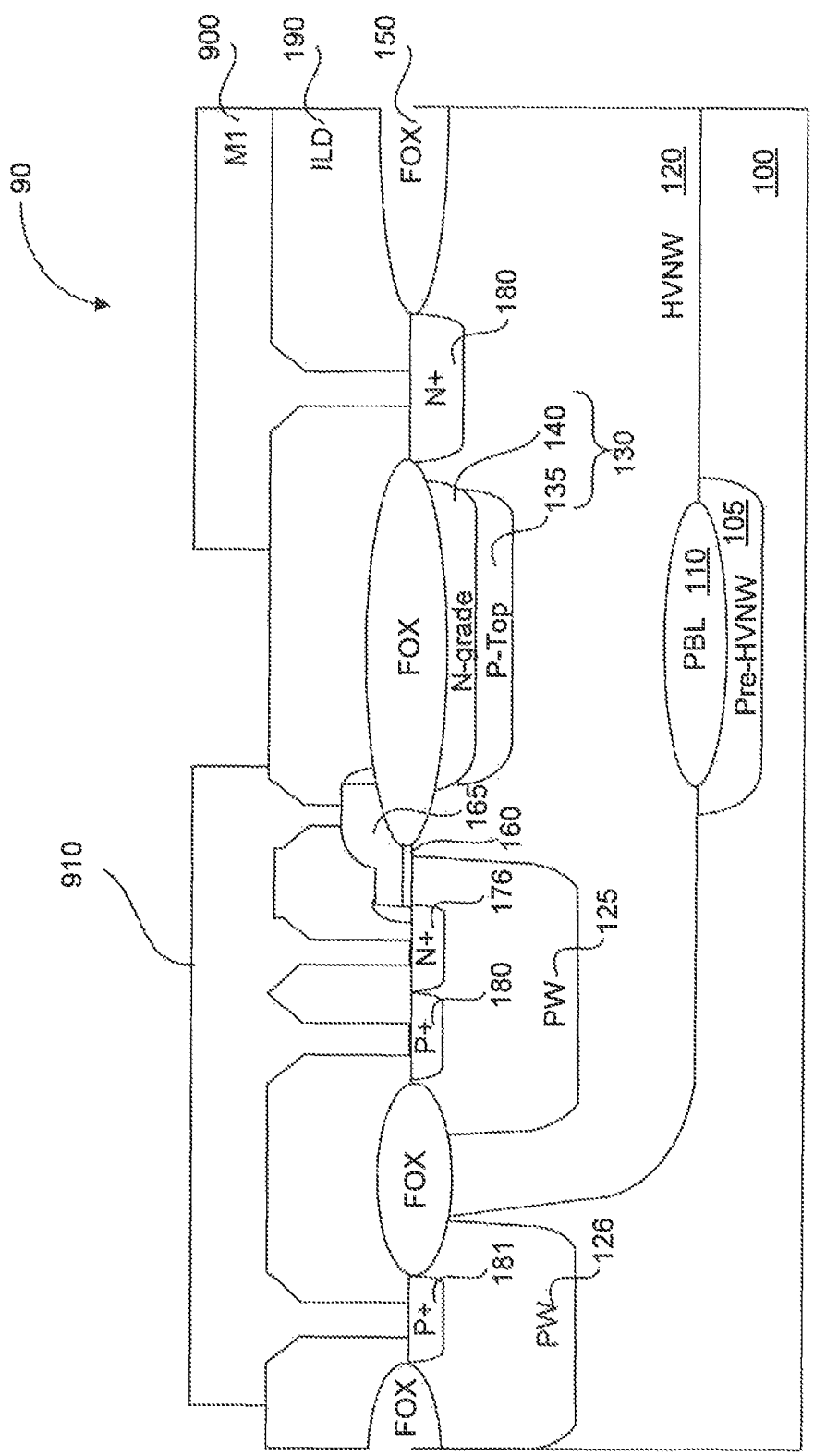
FIG. 9 schematically illustrates a cross-sectional view of an ultra-HV diode, according to an illustrated embodiment.

FIG. 9 schematically illustrates a cross-sectional view of an ultra-HV diode 90, according to an illustrated embodiment. Diode 90 has a structure similar to that of device 10, except that a contact layer 900 includes a contact portion 910 that conductively contacts second $N^+$-region 176, first $P^+$-region 180, and second $P^+$-region 181.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
 a substrate having a first conductivity type;
 a high-voltage well having a second conductivity type and formed in the substrate;
 a drift region formed in the high-voltage well;
 a plurality of buried layers having the first conductivity type and formed below the high-voltage well and vertically aligned with the drift region, the plurality of buried layers being spaced apart from each other; and
 a plurality of pre-high-voltage wells having the second conductivity type, each pre-high-voltage well being formed below a respective one of the buried layers,
 wherein the drift region includes:
  a top region having the first conductivity type and formed in the high-voltage well; and
  a grade region having the second conductivity type and formed above the top region.

2. The semiconductor device of claim 1, wherein the semiconductor device is a lateral diffused metal oxide semiconductor (LDMOS) device, the semiconductor device further including a drain region having the second conductivity type formed in the high-voltage well.

3. The semiconductor device of claim 1, wherein the semiconductor device is an insulated gate bipolar transistor, the semiconductor device further including a drain region having the first conductivity type formed in the high-voltage well.

4. The semiconductor device of claim 1, wherein the semiconductor device is a diode.

5. The semiconductor device of claim 1, wherein the first conductivity type is P-type and the second conductivity type is N-type.

6. The semiconductor device of claim 1, wherein the first conductivity type is N-type and the second conductivity type is P-type.

7. The semiconductor device of claim 1, further including:
 a source well having the first conductivity type and formed in the high-voltage well, the source well being spaced apart from the drift region;
 a source region formed in the source well;
 a drain region formed in the high-voltage well and spaced apart from the drift region;
 a gate oxide layer disposed on the substrate between the source region and the drain region; and
 a gate layer disposed on the gate oxide layer.

8. The semiconductor device of claim 1, further including:
 an interlayer dielectric layer disposed on the substrate; and
 a contact layer disposed on the interlayer dielectric layer.

9. A semiconductor device, comprising:
 a substrate having a first conductivity type;
 a high-voltage well having a second conductivity type and formed in the substrate;
 a drift region formed in the high-voltage well;
 a plurality of first buried layers having the first conductivity type and formed below the high-voltage well and vertically aligned with the drift region, the plurality of first buried layers being spaced apart from each other; and
 a plurality of second buried layers having the second conductivity type and formed below the high-voltage well, each one of the plurality of second buried layers being formed between two adjacent first buried layers,
 wherein the drift region includes:
  a top region having the first conductivity type and formed in the high-voltage well; and
  a grade region having the second conductivity type and formed above the top region.

10. A semiconductor device, comprising:
 a substrate having a first conductivity type;
 a high-voltage well having a second conductivity type and formed in the substrate;
 a drift region formed in the high-voltage well;
 a plurality of buried layers having the first conductivity type and formed below the high-voltage well and vertically aligned with the drift region, the plurality of buried layers being spaced apart from each other; and
 a pre-high-voltage well having the second conductivity type and formed below the plurality of buried layers,
 wherein the drift region includes:
  a top region having the first conductivity type and formed in the high-voltage well; and
  a grade region having the second conductivity type and formed above the top region.

* * * * *